(12) United States Patent
Xue

(10) Patent No.: US 12,255,159 B2
(45) Date of Patent: Mar. 18, 2025

(54) ANTENNA CHIP PACKAGING STRUCTURE AND METHOD FOR PREPARING SAME

(71) Applicant: SJ Semiconductor(Jiangyin) Corporation, Jiangyin (CN)

(72) Inventor: Yayuan Xue, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 370 days.

(21) Appl. No.: 17/546,473

(22) Filed: Dec. 9, 2021

(65) Prior Publication Data
US 2022/0181278 A1 Jun. 9, 2022

(30) Foreign Application Priority Data

Dec. 9, 2020 (CN) .................... 202011453915.X
Dec. 9, 2020 (CN) .................... 202022961113.1

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 21/568* (2013.01); *H01L 23/49811* (2013.01); *H01L 23/49822* (2013.01); *H01L 24/16* (2013.01); *H01L 2223/6677* (2013.01); *H01L 2224/16227* (2013.01)

(58) Field of Classification Search
CPC ... H01L 23/66; H01L 21/4857; H01L 21/568; H01L 23/49811; H01L 23/49822; H01L 24/16; H01L 2223/6677; H01L 2224/16227; H01L 23/562; H01L 21/6835; H01L 23/3128; H01L 24/13; H01L 2221/68345; H01L 2224/131; H01L 2224/16238; H01L 2924/3511; H01L 23/49816; H01L 2221/68359;
(Continued)

(56) References Cited

U.S. PATENT DOCUMENTS

2023/0260885 A1* 8/2023 Hung .................... H01Q 1/526
257/774

FOREIGN PATENT DOCUMENTS

CN 109727934 A * 5/2019
CN 210692484 U * 6/2020

* cited by examiner

*Primary Examiner* — Evan G Clinton
(74) *Attorney, Agent, or Firm* — IPRTOP LLC

(57) ABSTRACT

An antenna chip packaging structure and a method for preparing the antenna chip packaging structure are disclosed. The method includes forming multiple antenna structures: on a first support substrate with a redistribution layer on the first support substrate; forming each of the multiple antenna structures includes sequentially forming a first antenna layer, a first connection structure, and a first packaging layer on the redistribution layer; sequentially forming a second antenna layer, a second connection structure, and a second packaging layer above the first packaging layer; forming a third antenna layer above the second packaging layer; repeating the antenna structure forming process, before bonding a second support substrate above the last antenna structure on the last packaging layer; removing the first support substrate, and forming a UBM layer below the redistribution layer; and forming a solder ball on the UBM layer and connecting a chip to the UBM layer.

7 Claims, 7 Drawing Sheets

(51) Int. Cl.
*H01L 21/56* (2006.01)
*H01L 23/00* (2006.01)
*H01L 23/498* (2006.01)

(58) Field of Classification Search
CPC ........... H01L 2924/15192; H01L 2924/15321; H01Q 1/38; H01Q 1/2283
See application file for complete search history.

ANTENNA CHIP PACKAGING STRUCTURE AND METHOD FOR PREPARING SAME

CROSS REFERENCE TO RELATED APPLICATIONS

The present application claims the benefit of priority to Chinese Patent Application No. CN 202011453915X, entitled "ANTENNA CHIP PACKAGING STRUCTURE AND METHOD FOR PREPARING SAME", and Chinese Patent Application No. CN 2020229611131, entitled "ANTENNA CHIP PACKAGING STRUCTURE", both filed with CNIPA on Dec. 9, 2020, the disclosures of which are incorporated herein by reference in their entirety for all purposes.

FIELD OF TECHNOLOGY

The present disclosure generally relates to semiconductor packaging technology, in particular, to an antenna chip packaging structure and a method for preparing the same.

BACKGROUND

The fifth generation mobile communication technology (5G) is the latest generation of cellular mobile communication technology, which uses millimeter or centimeter radio frequency band communication and has the significant advantages of high data transmission rate, low latency, and the ability to support connectivity between large-scale devices.

Currently, in the packaging process related to 5G chips, the industry often integrate an antenna in the same packaging structure with other components such as semiconductor chips through the Antenna-in-Package (AiP) technology. By integrating the antenna with the packaging structure, the overall design can be effectively simplified so as to achieve miniaturization and reduce production cost.

However, existing antenna chip packaging structures have large package sizes and poor electrical and thermal performance, so it is difficult to optimize them for 5G chips, which will lead to performance degradation of 5G antenna chips. In addition, warping is likely to occur in current packaging processes. Too much warpage will cause the packaging structure to deform due to stress, affecting the reliability and the yield of final products.

Therefore, it is necessary to propose a new antenna chip packaging structure and a method for preparing the same to solve the above problems.

SUMMARY

The present disclosure provides a method for preparing an antenna chip packaging structure. The method comprises the following steps:
1) providing a first support substrate, and forming a redistribution layer above the first support substrate;
2) sequentially forming, above the redistribution layer, a first antenna layer electrically connected to the redistribution layer, a first connection structure connected to a part of the first antenna layer, and a first packaging layer covering the first antenna layer, the first connection structure, and the redistribution layer, followed by polishing the first packaging layer to expose a top surface of the first connection structure;
3) sequentially forming, above the first packaging layer, a second antenna layer electrically connected to the first connection structure, a second connection structure connected to the second antenna layer, and a second packaging layer covering the second antenna layer, the second connection structure, and the first packaging layer, followed by polishing the second packaging layer to expose a top surface of the second connection structure.
4) forming, above the second packaging layer, a third antenna layer electrically connected to the second connection structure;
5) bonding a second support substrate above the third antenna layer and the second packaging layer;
6) removing the first support substrate, forming an under-bump-metal (UBM) layer below the redistribution layer; and
7) forming a solder ball on the UBM layer and connecting the antenna chip to the UBM layer.

In one embodiment of the present disclosure, in step 1), the method further comprises a step of coating a first release layer on the first support substrate, and adhering the redistribution layer to the first support substrate by the first release layer; and in step 6), during the removal of the first support substrate, the first release layer is peeled off to separate the first support substrate from the redistribution layer.

In one embodiment of the present disclosure, the redistribution layer comprises at least one metal distribution layer and a dielectric layer wrapped around the metal distribution layer.

In one embodiment of the present disclosure, before step 6), the method further a step of forming a via in step 6, wherein forming the via occurs after removing the first support substrate and before forming the UBM layer, wherein the via exposes the metal distribution layer from the redistribution layer, and wherein the metal distribution layer is electrically connected to the UBM layer.

In one embodiment of the present disclosure, a method for forming the via comprises a laser drilling process.

In one embodiment of the present disclosure, before step 7), the method further comprises a step of removing the second support substrate.

In one embodiment of the present disclosure, after polishing the second packaging layer in step 3, further comprising: sequentially forming a fourth antenna layer electrically connected to the second connection structure, a fourth connection structure connected to the fourth antenna layer, and a fourth packaging layer, wherein the fourth packaging layer covers the fourth antenna layer, the fourth connection structure, and the second packaging layer, followed by polishing the fourth packaging layer to expose a top surface of the fourth connection structure; and wherein the fourth connection structure is connected to the third antenna layer in step 4.

In one embodiment of the present disclosure, the step of forming the solder ball on the UBM layer comprises a bumping process and a reflow soldering process.

The present disclosure further provides an antenna chip packaging structure. The antenna chip packaging structure comprises:
a redistribution layer;
a first antenna structure, comprising a first antenna layer electrically connected to the redistribution layer, a first connection structure connected to the first antenna layer, and a first packaging layer covering the first antenna layer, the first connection structure, and the redistribution layer, wherein the first antenna layer, the first connection structure, and the first packaging layer are disposed above the redistribution layer;

a second antenna structure, comprising a second antenna layer electrically connected to the first connection structure, a second connection structure connected to the second antenna layer, and a second packaging layer covering the second antenna layer the second connection structure, and the first packaging layer, wherein the second antenna layer, the second connection structure, and the second packaging layer are disposed above the first packaging layer;

a UBM layer, disposed on the redistribution layer; and a solder ball and a chip, connected to the UBM layer.

In one embodiment of the present disclosure, the redistribution layer comprises at least one metal distribution layer and a dielectric layer, wherein the dielectric layer is wrapped around the metal distribution layer.

In one embodiment of the present disclosure, a via is formed in the redistribution layer to expose the metal distribution layer, wherein the UMB layer is connected to the metal distribution layer.

In one embodiment of the present disclosure, the antenna chip packaging structure further comprises a third antenna structure, comprising a third antenna layer electrically connected to the second connection structure, a third connection structure connected to the third antenna layer, and a third packaging layer covering the third antenna layer, the third connection structure, and the second packaging layer; and a fourth antenna structure, comprising a fourth antenna layer electrically connected to the third connection structure, a fourth connection structure connected to the fourth antenna layer, and a fourth packaging layer covering the fourth antenna layer, the fourth connection structure, and the third packaging layer.

In the antenna chip packaging structure and the method for preparing the same provided in the present disclosure, a structure with multiple antenna layers is introduced, thereby reducing the size of the packaging structure; laser drilling is used, thereby improving the precision and reducing the cost of via formation processes; a UBM layer is introduced and is connected to a solder ball and a chip, achieving a desirable soldering effect and high reliability; and a second support substrate is introduced, thereby alleviating warpage of the packaging structure.

DETAILED DESCRIPTION

Figure 1:
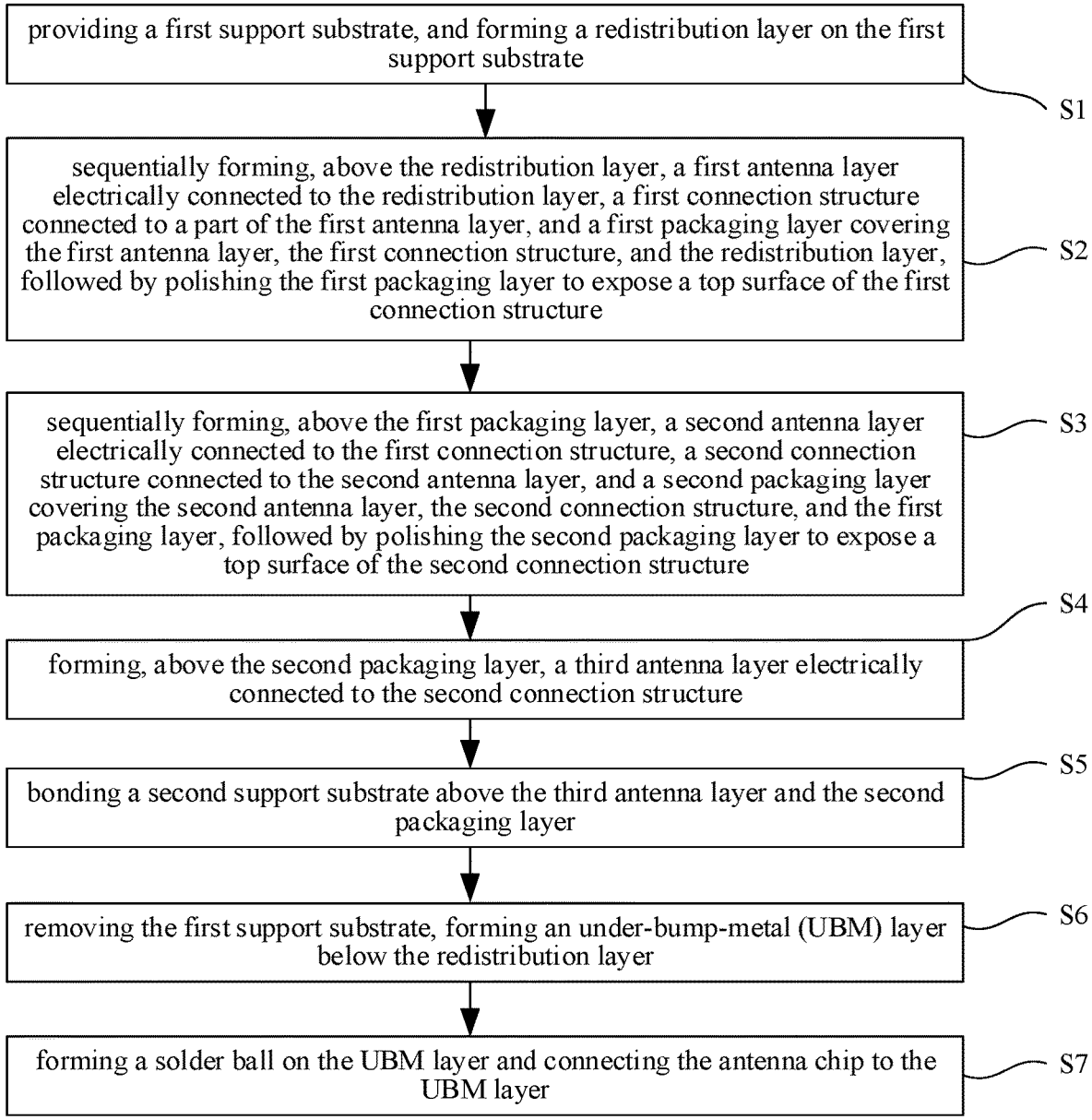
FIG. 1 is a flowchart of a method for manufacturing an antenna chip packaging structure according to Embodiment I of the present disclosure.

Implementations of the present disclosure are described as follows through specific embodiments, and a person skilled in the art may easily understand other advantages and effects of the present disclosure from the content disclosed in this specification. The present disclosure may also be implemented or applied through another different specific implementation, and any modification or variation may be made to each detail in this specification based on different opinions and applications without departing from the spirit of the present disclosure.

Referring to FIG. 1 to FIG. 18. It is to be noted that the drawings provided in these embodiments only illustrate the basic ideas of the present disclosure in a schematic manner. The drawings only show components related to the present disclosure, instead of drawing according to the numbers, shapes, and sizes of the components in actual implementation. In actual implementation, the type, quantity, and ratio of each component may be changed as needed, and the layout of the components may also be more complex.

Embodiment 1

Referring to FIG. 1 to FIG. 17, the present disclosure provides a method for preparing an antenna chip packaging structure. The method comprises the following steps:

1): Provide a first support substrate 101, and form a redistribution layer 102 on the first support substrate 101.

2): Sequentially form, above the redistribution layer 102, a first antenna layer 103 electrically connected to the redistribution layer 102, a first connection structure 104 connected to the first antenna layer 103, and a first packaging layer 105 which covers the redistribution layer 102, the first antenna layer 103, and the first connection structure 104; then polish the first packaging layer 105 to expose the top of the first connection structure 104.

3): Sequentially form, above the first packaging layer 105, a second antenna layer 106 electrically connected to the first connection structure 104, a second connection structure 107 connected to the second antenna layer 106, and a second packaging layer 108 covering the first packaging layer 105, the second antenna layer 106, and the second connection structure 107; parts of the second antenna layer 106 are aligned to parts of the first antenna layer respectively and the second connection structure is aligned to the first connection structure. However, a part of the second antenna layer can be smaller in size than the aligned-to part of the first antenna layer. Then polish the second packaging layer 108 to expose the top of the second connection structure 107.

4): Form, above the second packaging layer 108, a third antenna layer 109 electrically connected to the second connection structure 107.

5): Provide a second support substrate 110 above the second packaging layer 108 and the third antenna layer 109, and bond the second support substrate 110 to the second packaging layer 108 and the third antenna layer 109.

6): Remove the first support substrate 101, and form an under-bump-metal (UBM) layer 111 below the redistribution layer 102.

7): Form a solder ball 112 on the UBM layer 111 and connect a chip 113 to the UBM layer.

Figure 2:
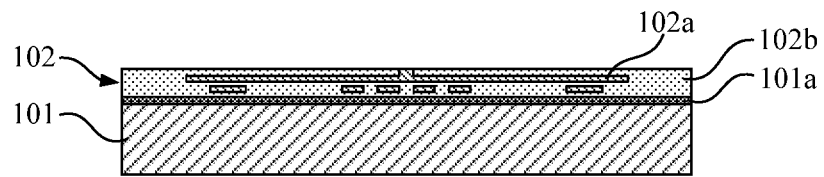
FIG. 2 is a schematic cross-sectional view of a first support substrate and a redistribution layer according to Embodiment I of the present disclosure.

In step 1), referring to step S1 in FIG. 1 and FIG. 2, the first support substrate 101 is first provided, and then the redistribution layer 102 is formed on the first support substrate 101.

As an example, as shown in FIG. 2, a first release layer 101a is further coated on the first support substrate 101. The redistribution layer 102 is adhered to the first support substrate 101 by the first release layer 101a. The first release layer 101a comprises a light to heat conversion (LTHC) layer. The LTHC layer is heated by a laser, so that the LTHC layer loses its viscosity and then the redistribution layer 102 can be separated from the first support substrate 101 at the LTHC layer.

As an example, the redistribution layer 102 comprises at least one metal distribution layer 102a and a dielectric layer 102b wrapped around the metal distribution layer 102. Optionally, a material of the metal distribution layer 102a comprises one or more of copper, aluminum, nickel, gold, silver, and titanium. A material of the dielectric layer 102b comprises one or more of epoxy resin, silica gel, polyimide, piperonyl butoxide (PBO), benzocylobutene (BCB), silicon oxide, phosphosilicate glass, and fluorine-containing glass. A process for depositing the metal distribution layer 102a comprises a chemical vapor deposition process, an evaporation process, a sputtering process, an electroplating process, or a chemical plating process. After deposition, the metal distribution layer 102a is patterned by lithography and etching processes. A process for forming the dielectric layer 102b comprises a chemical vapor deposition process or a physical vapor deposition process. By repeatedly forming a metal distribution layer 102a and a dielectric layer 102b, a redistribution layer 102 having a multilayer structure can be obtained. In one embodiment, there are two layers of metal distribution layers 102a.

In step 2), referring to S2 in FIG. 1, and FIGS. 3-6, the first antenna layer 103 connected to the redistribution layer 102, the first connection structure 104 connected to the first antenna layer 103, and the first packaging layer 105 that covers the redistribution layer 102, the first antenna layer 103 and the first connection structure 104, are successively formed above the redistribution layer 102.

Figure 3:
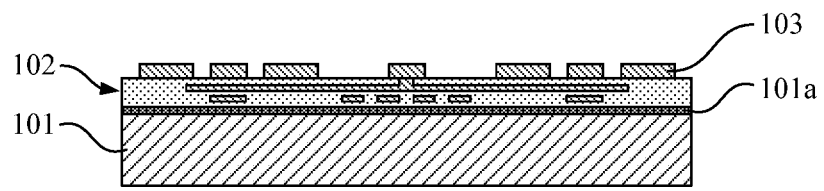
FIG. 3 is a schematic cross-sectional view of Embodiment I of the present disclosure after a first antenna layer is formed.

As shown in FIG. 3, the first antenna layer 103 connected to the metal distribution layer in the redistribution layer 102 is formed above the redistribution layer 102. A material of the antenna layer comprises one or more of copper, aluminum, nickel, gold, silver, and titanium, and it can be formed by one or more of chemical vapor deposition and physical vapor deposition. After deposition, the antenna layer is patterned by lithography and etching processes.

Figure 4:
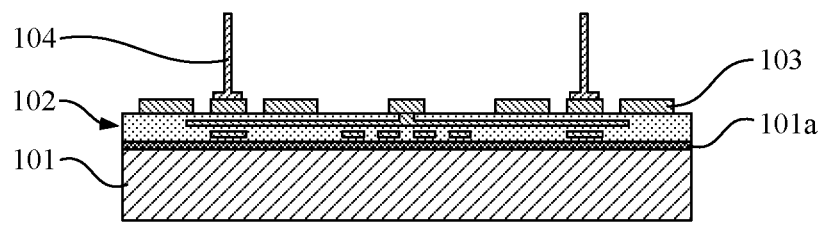
FIG. 4 is a schematic cross-sectional view of Embodiment I of the present disclosure after a first connection structure is formed.

As shown in FIG. 4, one end of a metal connecting wire is welded to an area between two parts of the first antenna layer 103 by a wire bonding process, and the other end extends upward to form the first connection structure 104. Optionally, the welding process comprises one of a hot-pressing wire bonding process, an ultrasonic wire bonding process, and a hot-pressing ultrasonic wire bonding process. A material of the metal connecting wire comprises gold, silver, copper, or aluminum. After one end of the metal connecting wire is welded to the first antenna layer 103, the metal connecting wire is extended upward and cut at the other end. In one embodiment, there is a plurality of such metal connecting wires and the other ends of the plurality of metal connecting wires obtained after cutting are on a same horizontal plane.

Figure 5:
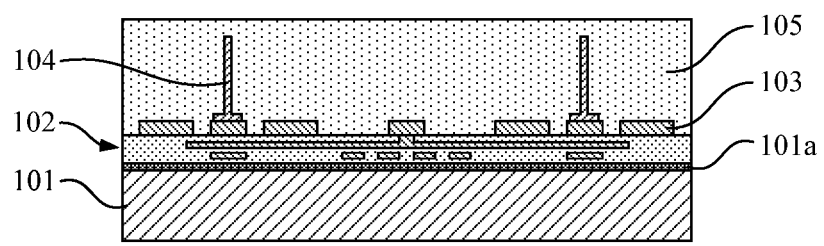
FIG. 5 is a schematic cross-sectional view of Embodiment I of the present disclosure after a first packaging layer is formed.

As shown in FIG. 5, the first packaging layer 105 is formed on the first antennal layer 103, and covers the redistribution layer 102, the first antenna layer 103, and the first connection structure 104. A material of the first packaging layer 105 comprises one of polyimide, silica gel, and epoxy resin and is formed by one of compression molding, transfer molding, liquid sealing, vacuum lamination, and spin coating.

Figure 6:
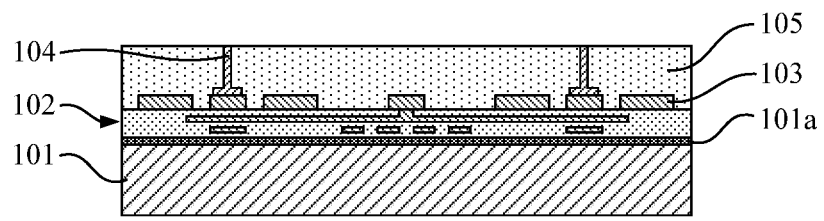
FIG. 6 is a schematic cross-sectional view of Embodiment I of the present disclosure after a grinding process applied to the first packaging layer.

As shown in FIG. 6, excessive parts of the first packaging layer 105 and the first connection structure 104 are removed by polishing, and a top surface of the first connection structure 104 is exposed.

In step 3), referring to step S3 in FIG. 1 and FIG. 7 to FIG. 10, these layers are sequentially formed above the first packaging layer 105: the second antenna layer 106 is connected to the first connection structure 104, the second connection structure 107 is connected to the second antenna layer 106, and the second packaging layer 108 covers the first packaging layer 105, the second antenna layer 106, and the second connection structure 107.

Figure 7:
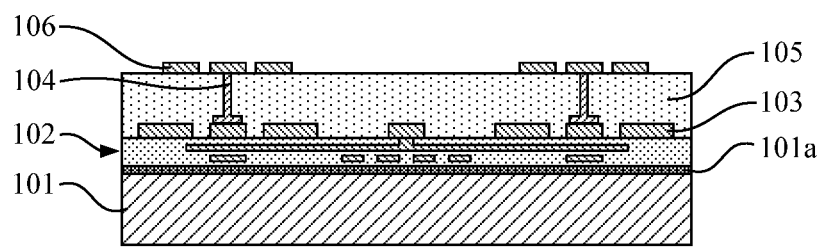
FIG. 7 is a schematic cross-sectional view of Embodiment I of the present disclosure after a second antenna layer is formed.

As shown in FIG. 7, the second antenna layer 106 is formed above the first packaging layer 105, wherein the second antenna layer 106 has a part connected to the first connection structure 104. The second antenna layer includes parts which are aligned to the first antenna layer but are not connected to the first connection structure 104. In one embodiment, the second antenna layer is made of the same materials as the first antenna layer 103, and is also made by the same process as the first antenna layer 103.

Figure 8:
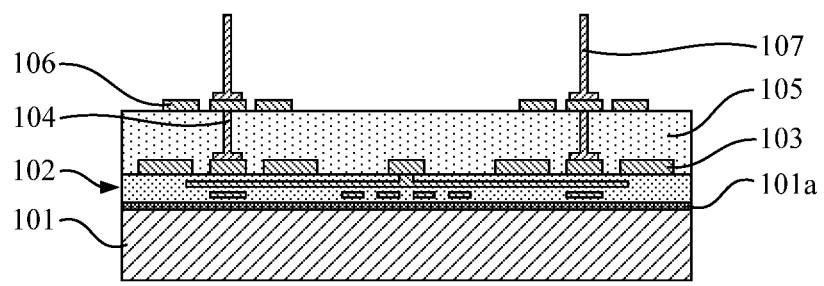
FIG. 8 is a schematic cross-sectional view of Embodiment I of the present disclosure after a second connection structure is formed.

As shown in FIG. 8, the second connection structure 107 connected to the second antenna layer 106 is formed on the second antenna layer 106. In one embodiment, the second connection structure is made of the same materials as the first connection structure 104 is, and made by the same technique as the first connection structure 104 is.

Figure 9:
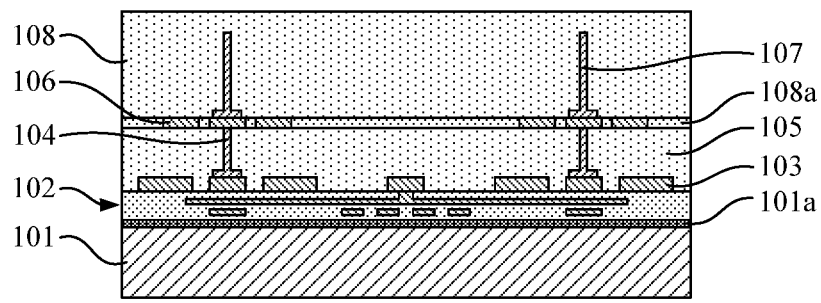
FIG. 9 is a schematic cross-sectional view of Embodiment I of the present disclosure after a second packaging layer is formed.
Figure 10:
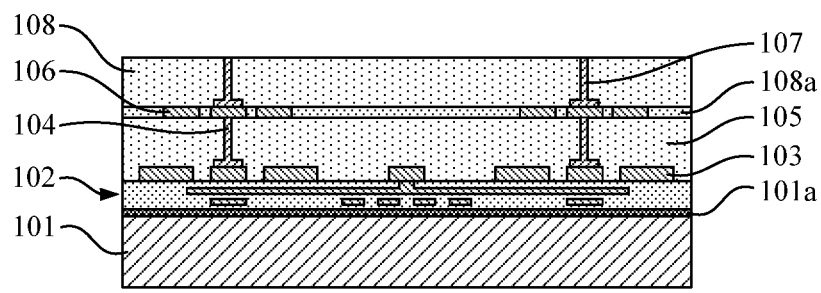
FIG. 10 is a schematic cross-sectional view of Embodiment I of the present disclosure after a grinding process applied to the second packaging layer.

As shown in FIG. 9 to FIG. 10, the second packaging layer 108 is formed and covers the first packaging layer 105, the second antenna layer 106, and the second connection structure 107. In one embodiment, the second packaging layer is made of the same materials as the first packaging layer 105 is, and made by the same method as the first packaging layer 105. Optionally, a buffer layer 108a is formed between the second packaging layer 108 and the first packaging layer 105. The buffer layer 108a can relieve the inter-layer stress between the two layers and protect the antenna layer structure from deformation and damage by the stress.

Figure 11:
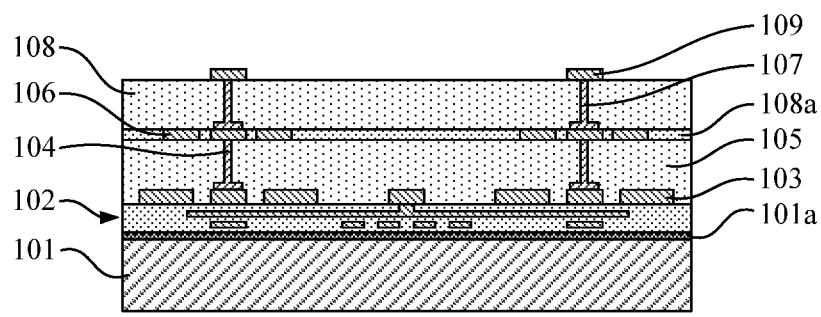
FIG. 11 is a schematic cross-sectional view of Embodiment I of the present disclosure after a third antenna layer is formed.

In step 4), referring to step S4 in FIG. 1 and FIG. 11, the third antenna layer 109 connected to the second connection structure 107 is formed above the second packaging layer 108.

As shown in FIG. 11, the third antenna layer 109 connected to the second connection structure 107 is formed above the second packaging layer 108. In one embodiment, the third antenna layer is made of the same materials as the first antenna layer 103 is, and is formed by the same technique as the first antenna layer 103.

Figure 12:
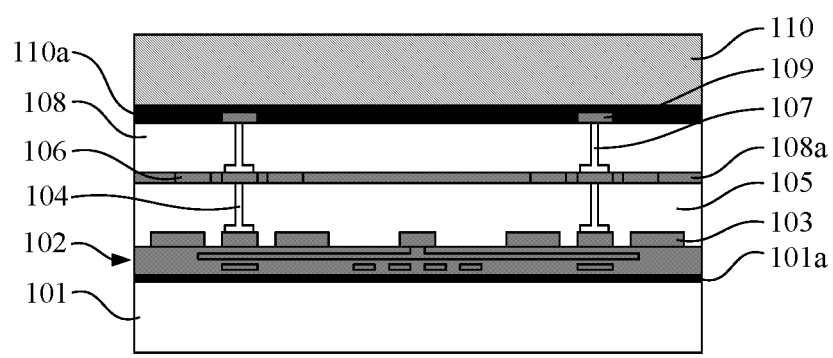
FIG. 12 is a schematic cross-sectional view of Embodiment I of the present disclosure after a second support substrate is bonded.

In step 5), referring to S5 in FIG. 1 and FIG. 12, the second support substrate 110 is formed above the second packaging layer 108 and the third antenna layer 109.

As an example, as shown in FIG. 12, the second support substrate 110 also comprises a second release layer 110a which can be an LTHC layer. The second release layer at the second support substrate 110 has the same function as the first release layer on the first support substrate. According to the present disclosure, the second support substrate 110 introduced as a temporary bonding substrate. The second support substrate 110 provides an additional fixing and supporting mechanism in the subsequent process, prevents abnormal warping of the packaging structure in the subsequent process, and can improve the performance of the packaging structure from stress induced abnormal warping.

In step 6), referring to S6 in FIG. 1 and FIG. 12 to FIG. 15, the first support substrate 101 is removed, and the UBM layer 111 is formed below the redistribution layer 102.

Figure 13:
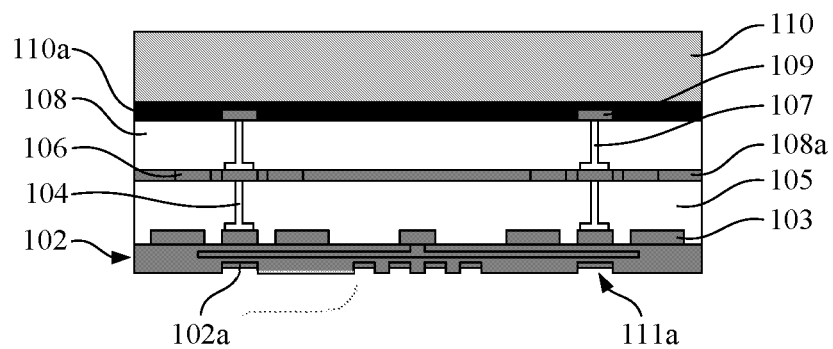
FIG. 13 is a schematic cross-sectional view of Embodiment I of the present disclosure after the first support substrate is removed.

As shown in FIG. 12 to FIG. 13, the first release layer 101a is peeled off by laser irradiation, thereby removing the first support substrate 101.

As shown in FIG. 13, after the first support substrate 101 is removed, the method further comprises a step of forming, in the redistribution layer 102, via holes 111a which are connected at bottom with the metal distribution layer 102a. Optionally, a method for forming the via 111a comprises a laser drilling process. Forming the via structure by a laser drilling process has significant advantages such as high precision and low costs. The metal distribution layer 102a is exposed from the bottom of the via 111a after the via is formed.

Figure 14:
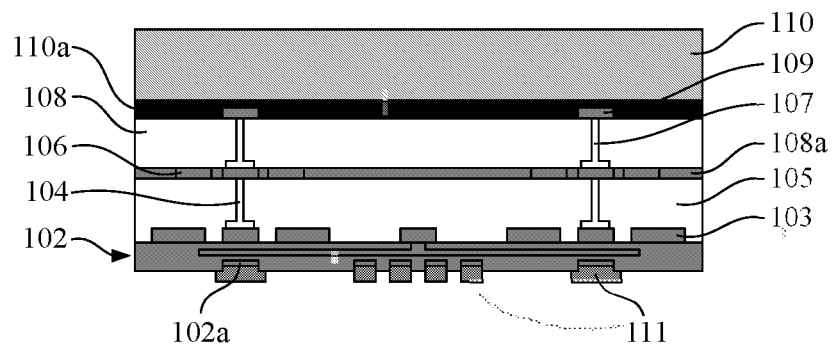
FIG. 14 is a schematic cross-sectional view of Embodiment I of the present disclosure after an under-bump-metal (UBM) layer is formed.

As shown in FIG. 14, the UBM layer 111 is formed below the redistribution layer 102 in a region where the via 111a is formed. The UBM layer 111 may be composed of a plurality of metal layers. The UBM layer can improve electrical connection between the solder ball and the chip, and has a desirable soldering effect in the reflow soldering process, thereby enhancing the reliability of the chip packaging structure.

Figure 15:
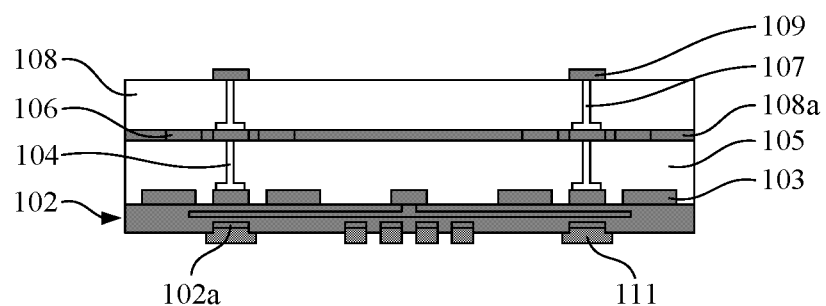
FIG. 15 is a schematic cross-sectional view of Embodiment I of the present disclosure after the second support substrate is removed.

As shown in FIG. 15, after the UBM layer 111 is formed, the method further comprises a step of removing the second support substrate 110 in a way similar to that of the first support substrate 101.

Figure 16:
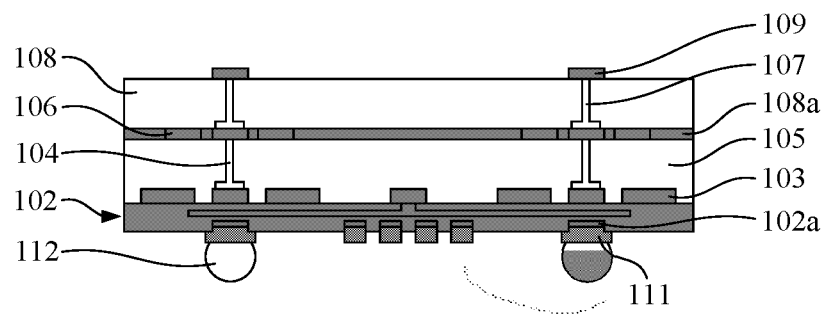
FIG. 16 is a schematic cross-sectional view of Embodiment I of the present disclosure after solder balls are formed.
Figure 17:
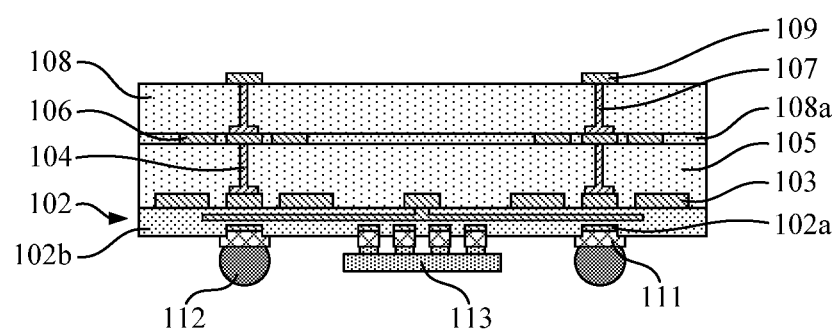
FIG. 17 is a schematic cross-sectional view of Embodiment I of the present disclosure after a chip is provided.

In step 7), referring to step S7 in FIG. 1 and FIG. 16 to FIG. 17, the solder ball 112 is formed on the UBM layer 111, and the chip 113 is connected to the UBM layer 111.

As shown in FIG. 16, the solder ball 112 is formed on the UBM layer 111. Optionally, the step of forming the solder ball 112 on the UBM layer 111 comprises a bumping process and a soldering reflow process.

As shown in FIG. 17, the chip 113 is connected to the UBM layer 111. Optionally, the chip 113 is a 5G chip.

In this embodiment, the first support substrate and the second support substrate are introduced, to ensure that the packaging structure is supported and held tight by the support substrates during the packaging, thereby preventing abnormal warping. The multi-antenna layer structure is introduced, reducing the size of the packaging structure; the laser drilling is used, improving the precision and reducing the cost of via formation; the UBM layer is introduced and is connected to the solder ball and the chip, achieving a desirable soldering effect and high reliability.

Embodiment II

Figure 18:
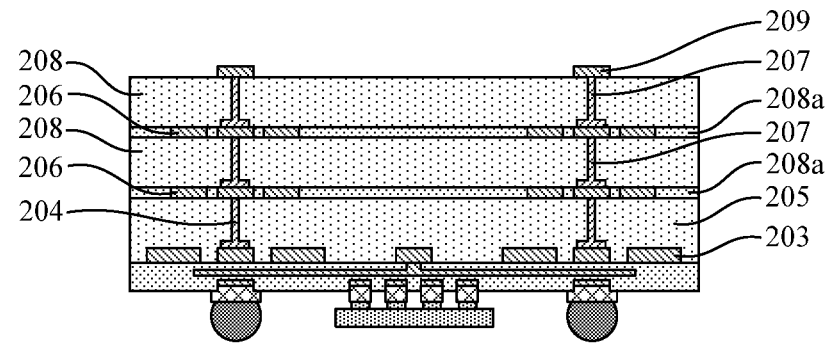
FIG. 18 is a schematic cross-sectional view of an antenna chip packaging structure of Embodiment II of the present disclosure.

As shown in FIG. 18, embodiment II provides a method for manufacturing an antenna chip packaging structure, and its difference from Embodiment I is as follows. In step 3), in Embodiment II, stacked up antenna structure can be formed. The stacked up antenna structure comprises what are in the Embodiment I, i.e. the first antenna layer, the first connection structure, and the first packaging layer, the second antenna layer, the second connection structure, and the second packaging layer; the third antenna layer, the third connection structure, and the third packaging layer. In addition, the Embodiment II further adds more antenna structures stacked up in sequence. The size and alignment geometry of the upper stacked up antenna layers are similar to the second and the third antenna layers, and all of which are not necessarily the same as the first antenna layer.

Each of the stacked up antenna layers above the second packaging layer covers a lower antenna layer and connects to the lower antenna layer's connection structure, similarly like how the third antenna layer connects to the second antenna layer.

The lowest stacked up antenna layer, the second antenna layer, is connected to the first connection structure, and the top one of the stacked up antenna connection structure is connected to the second support substrate.

As an example, in FIG. 18, a multi-layer stacked structure is formed between the first packaging layer 205 and the top antenna layer 209 and comprises multiple antenna layers 206, all of which are similar-to-the-second antenna layers from the second connection structure 207, and second packaging layer 208. A buffer layer 208a is further formed between two adjacent packaging layers to ease the interlayer stress. The lowest antenna layer 206 of the stacked up antenna layers (second and above) is connected to the first connection structure 204. The first connection structure 204 is connected to the first antenna layer 203. The top one of connection structures 207 is connected to the highest antenna layer 209. In other embodiments of the present disclosure, the stacked up antenna structures may comprise three or more layers.

Other implementations of this embodiment are the same as those of Embodiment I, and therefore relevant details are not repeated herein.

Embodiment III

As shown in FIG. 17, this embodiment provides an antenna chip packaging structure. The antenna chip packaging structure comprises:

a redistribution layer 102;

a first antenna layer 103 connected to the redistribution layer 102, a first connection structure 104 connected to the first antenna layer 103, and a first packaging layer 105 covering the redistribution layer 102, the first antenna layer 103, and the first connection structure 104, wherein the first antenna layer, the first connection structure, and the first packaging layer are located above the redistribution layer 102;

a second antenna layer 106 connected to the first connection structure 104, a second connection structure 107 connected to the second antenna layer 106, and a second packaging layer 108 covering the first packaging layer 105, the second antenna layer 106, and the second connection structure 107, wherein the second antenna layer, the second connection structure, and the second packaging layer are located above the first packaging layer 105;

a UBM layer 111, located below the redistribution layer 102; and a solder ball 112 and a chip 113, connected to the UBM layer 111.

As an example, as shown in FIG. 17, the redistribution layer 102 comprises at least one metal distribution layer 102a and a dielectric layer 102b wrapped around the metal distribution layer 102a. As shown in FIG. 13, a via 111a connected to the metal distribution layer 102a is further formed in the redistribution layer 102.

As an example, as shown in FIG. 18, a stacked structure is formed above the first packaging layer 205 and comprises a plurality of second antenna layers 206, a plurality of second connection structures 207, and a plurality of second packaging layers 208. The plurality of second packaging layers 208 is stacked in sequence and each covers a corresponding second antenna layer 206 and second connection structure 207. The plurality of second antenna layers 206 are connected to each other by the plurality of second connection structures 207. The bottommost one of the plurality of second antenna layers 206 is connected to the first connection structure 204, and the topmost one of the plurality of second connection structures 207 is connected to the third antenna layer 209. The connection structures at all antenna layers overlap vertically. The parts of the first antenna layer not connected with the first connection structure align to and are larger than the parts of the other antenna layers not connected with the corresponding connection structures.

In conclusion, the present disclosure provides an antenna chip packaging structure and a method for preparing the same. The method for preparing an antenna chip packaging structure comprises the following steps: 1) Provide a first support substrate, and form a redistribution layer on the first support substrate; 2) Successively form, above the redistribution layer, a first antenna layer connected to the redistribution layer, a first connection structure connected to the first antenna layer, and a first packaging layer covering the redistribution layer, the first antenna layer, and the first connection structure; 3) Successively form, above the first packaging layer, a second antenna layer connected to the first connection structure, a second connection structure connected to the second antenna layer, and a second packaging layer covering the first packaging layer, the second antenna layer, and the second connection structure; 4) Form, above the second packaging layer, a third antenna layer connected to the second connection structure; 5) Bond a second support substrate above the second packaging layer and the third antenna layer; 6) Remove the first support substrate, and form a UBM layer below the redistribution layer; 7) Form a solder ball on the UBM layer and connect a chip to the UBM layer. A structure with multiple antenna layers is introduced, thereby reducing the size of the packaging structure; laser drilling is used, thereby improving the precision and reducing the cost of via formation processes; a UBM layer is introduced and is connected to a solder ball and a chip, achieving a desirable soldering effect and high reliability; and a second support substrate is introduced, thereby alleviating warpage of the packaging structure.

The above embodiments merely exemplarily describe the principles and effects of the present disclosure, and are not intended to limit the present disclosure. Any person familiar with this technology all may make modifications or variations to the above embodiments without departing from the spirit and scope of the present disclosure. Therefore, all equivalent modifications or changes made by a person of ordinary skill in the art without departing from the spirit and technical ideas disclosed in the present disclosure shall still fall within the scope of the claims of the present disclosure.

What is claimed is:

1. A method for preparing an antenna chip packaging structure, comprising:

step 1: providing a first support substrate, and forming a redistribution layer on the first support substrate;

step 2: sequentially forming, above the redistribution layer, a first antenna layer electrically connected to the redistribution layer, a first connection structure connected to a part of the first antenna layer, and a first packaging layer covering the first antenna layer, the first connection structure, and the redistribution layer, followed by polishing the first packaging layer to expose a top surface of the first connection structure;

step 3: sequentially forming, above the first packaging layer, a second antenna layer electrically connected to the first connection structure, a second connection structure connected to the second antenna layer, and a second packaging layer covering the second antenna layer, the second connection structure, and the first packaging layer, followed by polishing the second packaging layer to expose a top surface of the second connection structure;

step 4: forming, above the second packaging layer, a third antenna layer electrically connected to the second connection structure;

step 5: bonding a second support substrate above the third antenna layer and the second packaging layer;

step 6: removing the first support substrate, forming an under-bump-metal (UBM) layer below the redistribution layer, then removing the second support substrate; and step 7: forming a solder ball on the UBM layer and connecting the antenna chip to the UBM layer.

2. The method for preparing the antenna chip packaging structure as in claim 1, wherein in step 1, the method further comprises a step of coating a first release layer on the first support substrate, and adhering the redistribution layer to the first support substrate by the first release layer; and wherein in step, during the removal of the first support substrate, the first release layer is peeled off to separate the first support substrate from the redistribution layer.

3. The method for preparing the antenna chip packaging structure as in claim 1, wherein the redistribution layer comprises at least one metal distribution layer and a dielectric layer wrapped around the metal distribution layer.

4. The method for preparing the antenna chip packaging structure as in claim 3, further comprising a step of forming a via in step 6, wherein forming the via occurs after removing the first support substrate and before forming the UBM layer, wherein the via exposes the metal distribution layer from the redistribution layer, and wherein the metal distribution layer is electrically connected to the UBM layer.

5. The method for preparing the antenna chip packaging structure as in claim 4, wherein forming the via comprises a laser drilling process.

6. The method for preparing the antenna chip packaging structure as in claim 1, after polishing the second packaging layer in step 3, further comprising: sequentially forming a fourth antenna layer electrically connected to the second connection structure, a fourth connection structure connected to the fourth antenna layer, and a fourth packaging layer, wherein the fourth packaging layer covers the fourth antenna layer, the fourth connection structure, and the second packaging layer, followed by polishing the fourth packaging layer to expose a top surface of the fourth connection structure; and wherein the fourth connection structure is connected to the third antenna layer in step 4.

7. The method for preparing the antenna chip packaging structure as in claim 1, wherein the step 7 of forming the solder ball on the UBM layer comprises a bumping process and a reflow soldering process.

* * * * *